United States Patent [19]
Daskalakis et al.

[11] Patent Number: 6,025,990
[45] Date of Patent: Feb. 15, 2000

[54] PROCESSOR SUPPORT ASSEMBLY

[75] Inventors: George Daskalakis, Forest Grove; Stephen Brown, Portland, both of Oreg.

[73] Assignee: Intel Corporation, Santa Clara, Calif.

[21] Appl. No.: 09/001,171

[22] Filed: Dec. 30, 1997

[51] Int. Cl.[7] .................................................. H05K 7/20
[52] U.S. Cl. ...................... 361/704; 361/690; 361/707; 361/729; 361/752; 361/759; 174/51; 174/16.3; 257/718; 165/185; 439/160
[58] Field of Search ..................... 361/683, 690, 361/694, 754, 759, 801, 807, 740, 684, 686, 700–719, 785, 729, 737, 788, 753; 439/62, 637, 570, 326, 631, 160, 61, 329, 571; 211/41.17; 257/713, 723, 668; 165/80.3, 80.4, 185; 174/72 B; 710/101

[56] References Cited

U.S. PATENT DOCUMENTS

| | | | |
|---|---|---|---|
| 4,647,123 | 3/1987 | Chin et al. | 339/17 LM |
| 5,163,833 | 11/1992 | Olsen et al. | 439/61 |
| 5,436,794 | 7/1995 | Clemente et al. | 361/704 |
| 5,748,446 | 5/1998 | Feightner et al. | 361/709 |
| 5,829,601 | 11/1998 | Yurchenco et al. | 211/41.17 |
| 5,856,910 | 1/1999 | Yurchenco et al. | 361/704 |
| 5,906,497 | 5/1999 | Pham et al. | 439/160 |

*Primary Examiner*—Leo P. Picard
*Assistant Examiner*—Michael Datskovsky
*Attorney, Agent, or Firm*—Blakely, Sokoloff, Taylor & Zafman LLP

[57] ABSTRACT

A method and apparatus for supporting within a chassis enclosure a plurality of microprocessors, each operably coupled to a heat sink, includes mounting within the chassis enclosure one or more retention brackets, each retention bracket adapted to receive at least one microprocessor and a cover engaged about the top of at least one microprocessor, the cover being releasably fastenable to the retention bracket, and further including the coupling together of multiple retention brackets to form a bridge-like assembly.

20 Claims, 4 Drawing Sheets

PROCESSOR SUPPORT ASSEMBLY

BACKGROUND OF THE INVENTION

1. Field of the Invention

This invention relates generally to an assembly for supporting one or more microprocessors in a chassis enclosure, and more particularly, to a modular microprocessor cartridge retaining assembly suitable for use in multiple microprocessor cartridge applications in which, inter alia, selective extraction of one or more of a plurality of microprocessor cartridges may be desired.

2. Description of the Related Art

Microprocessors historically have been mounted within systems directly upon printed circuit boards (motherboards). As microprocessor technology has developed and the speed of microprocessors has increased, such mounting arrangements have become unworkable, primarily because of the requirements for increased cooling associated with the faster microprocessors. To cool these faster microprocessors, it is common to pair each microprocessor with a heat sink to form a microprocessor assembly that typically is situated off of the motherboard so as to allow for a steady flow of cooling air around the assembly.

Having to pair each microprocessor with a heat sink results in an increase in the overall physical size and weight of the microprocessor assembly to be mounted within the chassis enclosure. Raising the microprocessors off of the motherboard raises the center of gravity of the microprocessor to a point removed from the motherboard. This arrangement means that the microprocessor assembly, as mounted, is oriented like a cantilever, which creates areas of increased stress at the junction of the microprocessor assembly and motherboard upon any relative movement between the two. Thus, in mounting these larger microprocessor assemblies, a holding arrangement is needed that not only accounts for the problems associated with increased cooling requirements, but that also structurally retains the microprocessor assembly so as to avoid damage that might result from shocks or vibrations to the system during, e.g., assembly, shipping, movement or operation.

Prior bracketing systems for microprocessor assemblies generally include a single individual bracket coupling a cartridge to a motherboard within a chassis. However, these prior systems provide only a limited solution to the problems set forth above. The prior systems can be used where one microprocessor cartridge is needed in a particular chassis. The prior systems fail to provide for a modular arrangement adaptable to a multiprocessor environment, i.e., applications involving systems requiring, e.g., 2, 4, 6 or 8 microprocessors, in which the selective extraction with relative ease of one or more of the plurality of microprocessors might be desired.

The present invention is directed to overcoming, or at least reducing the effects of, one or more of the problems set forth above.

SUMMARY OF THE INVENTION

In one aspect of the present invention, an apparatus is provided for supporting a microprocessor within a chassis enclosure. A retention bracket is coupled to the chassis enclosure and receives a microprocessor cartridge and a cover therein. The microprocessor cartridge includes a microprocessor operably paired with at least one heat sink for dissipating heat generated by the microprocessor during operation. The cover releasably engages the microprocessor cartridge and is fastenable to the retention bracket when the retention bracket has received the microprocessor cartridge.

In another aspect of the present invention, a method is provided for mounting one or more microprocessors within a chassis enclosure. The method includes attaching a cover about the top of the microprocessor, and mounting within the chassis enclosure a retention bracket adapted to receive the microprocessor and cover. The microprocessor is inserted into the retention bracket, and the cover is releasably coupled to the retention bracket.

BRIEF DESCRIPTION OF THE DRAWINGS

Other objects and advantages of the invention will become apparent upon reading the following detailed description and upon reference to the drawings in which.

Figure 1:
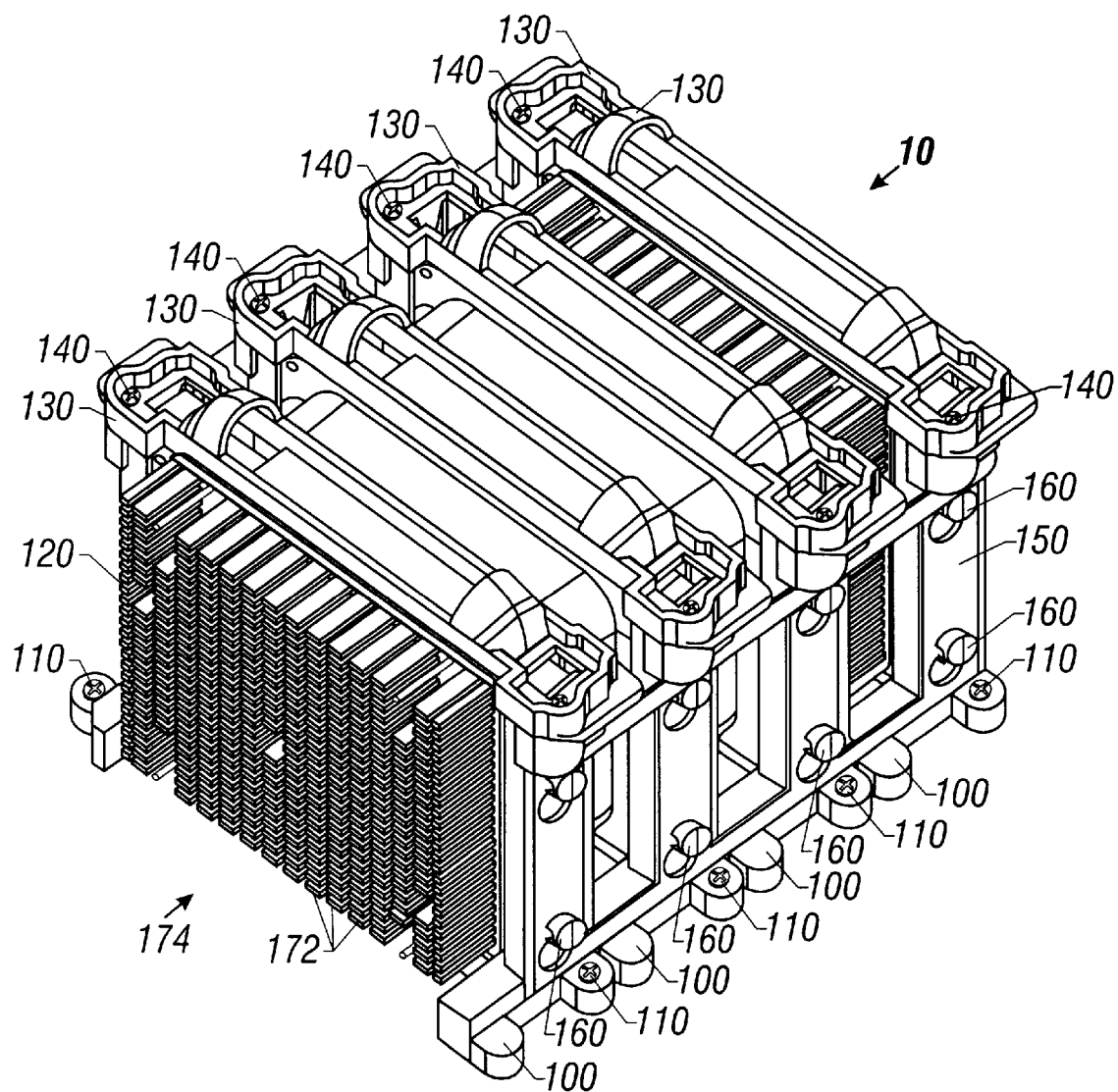
FIG. 1 illustrates a perspective view of an exemplary microprocessor mounting assembly in accordance with the present invention including four microprocessor modules.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings and referring initially to FIG. 1, in a first embodiment of the present invention, an assembly 10 for mounting and supporting microprocessors within a chassis enclosure includes a plurality of retention brackets 100 mounted within the chassis enclosure (not shown). In the illustrated embodiment, four brackets 100 are shown, but any number of brackets 100 may be grouped together according to the needs of the specific implementation. Each retention bracket 100 is attached to the chassis enclosure by a pair of screws 110, although other fastening means may also be used, depending upon the requirements involved in a particular desired application. The retention brackets 100 are mounted within the chassis enclosure to form a bridge structure, so that when microprocessor cartridges 120 (see FIG. 2) are inserted, the cartridges 120 are spaced to allow for sufficient cooling airflow, and movement between the microprocessor cartridges 120 and between each cartridge 120 and the chassis enclosure is minimized. The spacing between microprocessors is about 2 inches in one embodiment.

Figure 2:
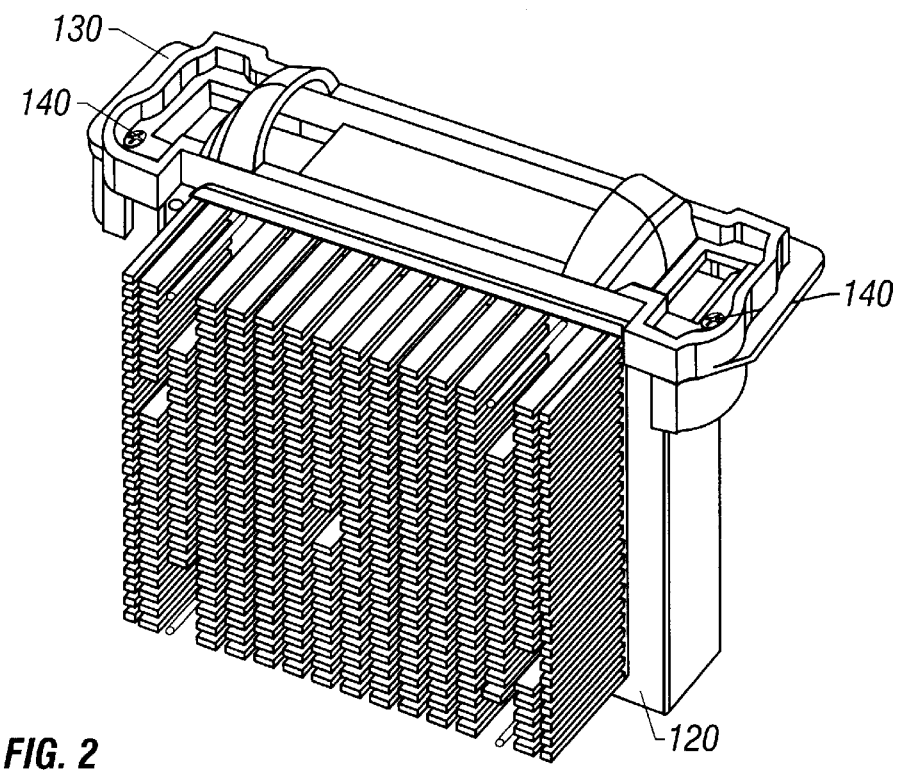
FIG. 2 illustrates in accordance with the present invention a perspective view of a top cover attached to a microprocessor cartridge comprising a microprocessor/heat sink pair, as shown in FIG. 1.
Figure 3A:
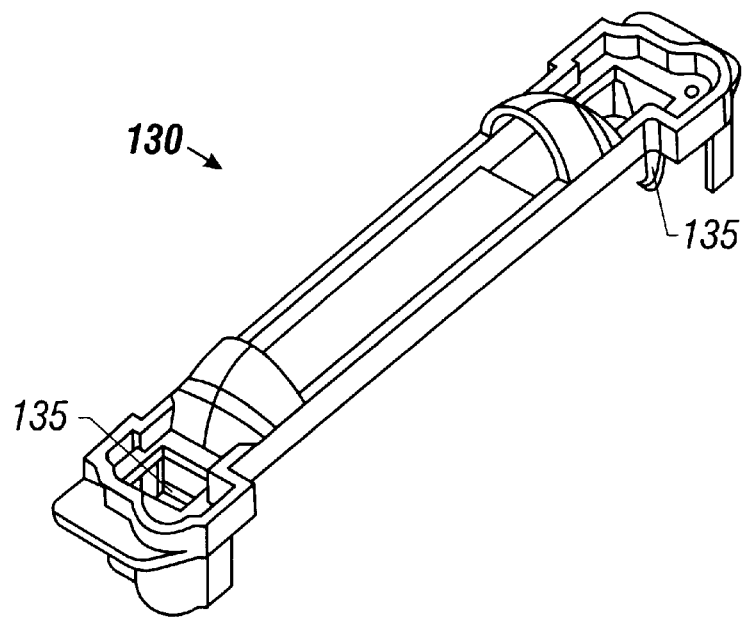
FIGS. 3A and 3B illustrate in accordance with the present invention perspective views of the top cover shown in FIG. 2.
Figure 3B:
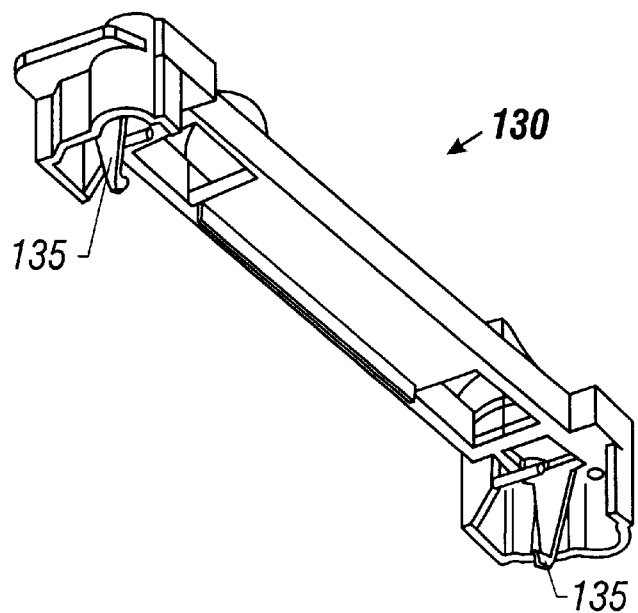
Figure 4A:
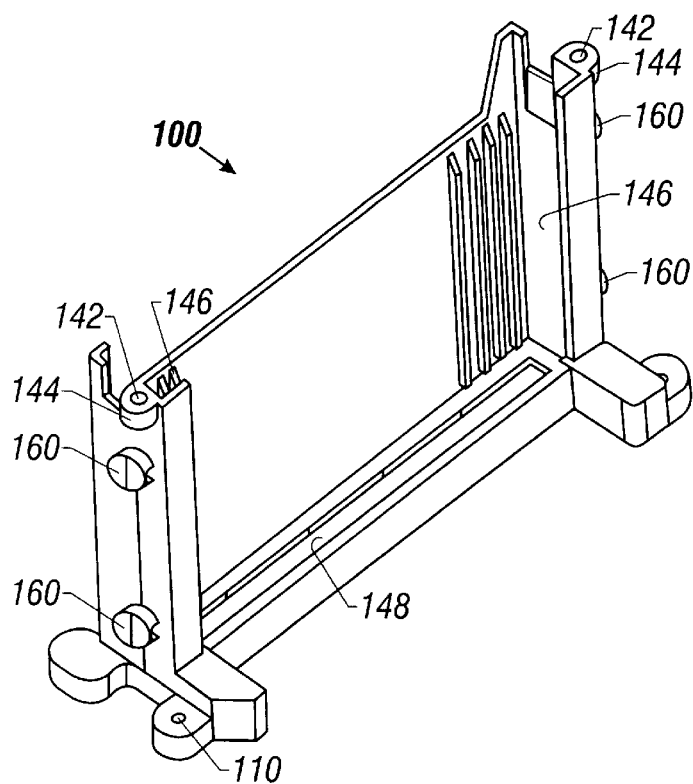
FIGS. 4A and 4B illustrate in accordance with the present invention perspective views of an exemplary retention bracket, as shown in FIG. 1.

Each microprocessor cartridge 120, as shown in FIGS. 1 and 2, includes a top cover 130 having a locking assembly 135 (see FIGS. 3A and 3B) for engaging the sides of the microprocessor/heat sink pair or cartridge 120. Each top cover 130 is releasably fastenable through the use of screws 140, or other suitable coupling means, to its respective retention bracket 100. Thus, the top cover 130 allows the microprocessor cartridge 120 to be extracted from the chassis enclosure with relative ease with the removal of screws 140 and by pulling on the cover 130. As shown in FIG. 4A, the screws 140 engage threads 142 in tabs 144 on the retention bracket 100. The cartridge 120 slides vertically within a U-shaped track 146 positioned on opposite ends of the retention bracket 100 to guide the cartridge 120 into engagement with an electrical connector (not shown) located on the chassis enclosure and positioned in an opening 148 extending across the bottom of the retention bracket 100.

Figure 5:
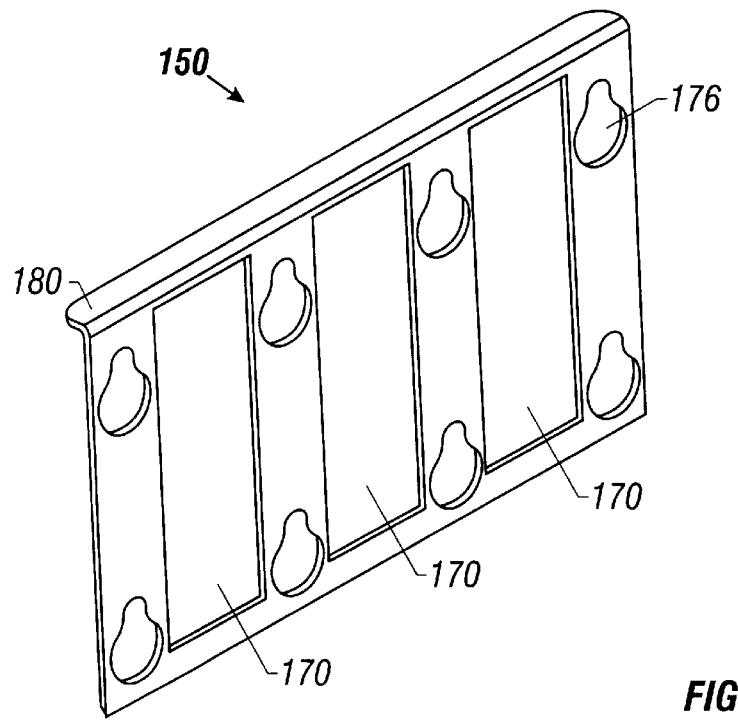
FIG. 5 illustrates in accordance with the present invention a perspective view of an exemplary side plate, as shown in FIG. 1.
Figure 4B:
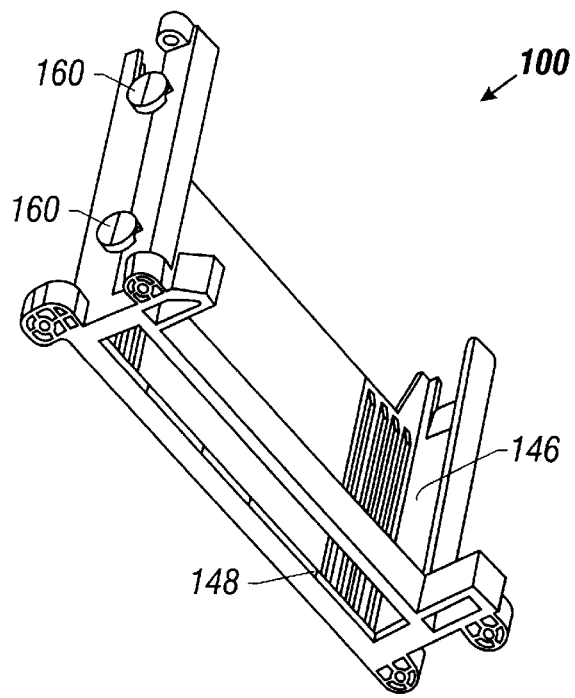

The retention brackets 100 have knobs or posts 160 (see FIGS. 4A and 4B) over which keyhole-shaped openings 176 in side plates 150 (see FIG. 5) are disposed. The side plates 150 engage the posts 160 of each of the brackets 100 to help maintain the spacing between the cartridges 120 and to provide a lateral stiffening of the assembly 10. The plates 150 reduce any tendency of the cartridges 120 to lean or become "racked." The side plates 150 include one or more openings 170 of sufficient size and shape to allow air flow to enter and cool tines 172 of heat sinks 174 individually attached to each microprocessor (not shown). The side plates 150 have a flange portion 180 that abuts a lower portion of the top covers 130. Thus, in the event that any one of the microprocessor cartridges 120 is installed within the chassis enclosure, the side plates 150 may not be removed, as the keyhole-shaped openings 176 are positioned with the narrow portion of their opening extending behind the knobs 160, and the top covers 130 prevent the side plates 150 from being raised.

The microprocessor mounting assembly 10 in accordance with one embodiment of the present invention is self-contained, in that the microprocessor cartridges 120 are retained without ties to the chassis enclosure, other that the screws 110 attaching the retention brackets 100 to the chassis enclosure. The assembly 10 holds the microprocessors stable so that movement as a result of shocks or vibrations (which might occur, e.g., during assembly, shipping, movement or operation) is minimized. The assembly 10 is adapted not only to provide the microprocessor with structural support, but also to achieve the desired airflow at each microprocessor heat sink 174. Enhanced cooling is provided by restricting the volume of space around the microprocessor cartridges 120, which has the effect of concentrating the air at the inlet of the heat sinks 174.

Although the embodiment of the present invention shown in FIG. 1 includes four microprocessor modules, the present invention is not so limited. In accordance with one embodiment of the present invention, the microprocessor support assembly 10 is modular and is readily adaptable to a multiprocessor environment. For example, the retention bracket 100 may be configured to hold not only one, but two, three or more microprocessor cartridges. Further, in a particular application involving four microprocessors, an alternate configuration to the assembly 10 having four single microprocessor modules 120 might be an assembly including two double microprocessor modules. Obviously, the exact configuration used will depend upon the particular circumstances involved in a particular desired application.

The particular embodiments disclosed above are illustrative only, as the invention may be modified and practiced in different but equivalent manners apparent to those skilled in the art having the benefit of the teachings herein. Furthermore, no limitations are intended to the details or construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus for supporting a plurality of microprocessors within a chassis enclosure, comprising:
   a first retention bracket mounted to said chassis enclosure;
   a first microprocessor disposed within said first retention bracket;
   a first cover releasably attached about the top of said first microprocessor to said first retention bracket;
   a second retention bracket mounted to said chassis enclosure;
   a second microprocessor disposed within said second retention bracket;
   a second cover releasably attached about the top of said second microprocessor to said second retention bracket; and,
   a side plate coupled to said first and said second retention brackets.

2. The apparatus of claim 1, wherein said first and second microprocessors are coupled to a first and second heat sink.

3. An apparatus comprising:
   a first retention bracket coupled to a base and configured for supporting a first microprocessor assembly on at least two edges of said first microprocessor assembly;
   a second retention bracket coupled to said base and configured for supporting a second microprocessor assembly on at least two edges of said second microprocessor assembly; and
   a side plate coupled to said first and second retention brackets, said side plate providing lateral support for said first and said second retention brackets.

4. The apparatus of claim 3 further comprising a plurality of openings in said side plate for cooling.

5. The apparatus of claim 3 wherein said first and second retention brackets each further comprise a U-shaped track for supporting the first and second microprocessors.

6. The apparatus of claim 3 wherein said first and second retention brackets are spaced approximately two inches apart to allow for a cooling airflow.

7. The apparatus of claim 5 wherein said first and second retention brackets each further comprise an opening in said track such that the first and second microprocessors conform an electrical connection through said openings.

8. An apparatus comprising:
   a first retention bracket;

a first top cover releasably coupled to said first retention bracket, said first top cover for locking a first microprocessor into said first retention bracket;

a second retention bracket;

a second top cover releasably coupled to said second retention bracket, said second top cover for locking a second microprocessor into said second retention bracket; and, a side plate coupled to said first and said second retention brackets, said side plate providing lateral support for said first and said second retention brackets.

9. The apparatus of claim 8 further comprising a first and second heat sink coupled to said first and second microprocessor.

10. The apparatus of claim 8 wherein said first and second retention brackets are mounted on a chassis enclosure.

11. The apparatus of claim 8 wherein said first and second retention brackets each further comprise a U-shaped track for supporting the first and second microprocessors.

12. The apparatus of claim 8 wherein said first and second retention brackets are spaced approximately two inches apart to allow for a cooling airflow.

13. The apparatus of claim 12 further comprising a plurality of openings in said side plate for cooling.

14. The apparatus of claim 11 wherein said first and second retention brackets each further comprise an opening in said track such that said first and second microprocessors can conform an electrical connection through said openings.

15. A method of supporting a plurality of microprocessors, comprising:

mounting a first retention bracket;

mounting a second retention bracket;

attaching a side plate extending between said first and second retention brackets;

attaching a first cover about the top of a first microprocessor;

inserting said first microprocessor into said first retention bracket;

attaching a second cover about the top of a second microprocessor; and, inserting the second microprocessor into said retention bracket.

16. The method of claim 15 further comprising:

releasably coupling said first cover to said first retention bracket; and, releasably coupling said second cover to said second retention bracket.

17. The method of claim 15 further comprising:

coupling a first heat sink to said first microprocessor; and, coupling a second heat sink to said second microprocessor.

18. The apparatus of claim 3, wherein said side plate is disposed perpendicular to said base.

19. The apparatus of claim 18, wherein said side plate is disposed perpendicular to each of said first and second retention brackets.

20. The apparatus of claim 8, wherein:

said side plate is non-removable from any of said first and second retention brackets if said first top cover is coupled to said first retention bracket; and said side plate is non-removable from any of said first and second retention brackets if said second top cover is coupled to said second retention bracket.

* * * * *